United States Patent [19]

Steckler et al.

[11] 4,164,711
[45] Aug. 14, 1979

[54] TUNING SYSTEM INCLUDING A MEMORY FOR STORING TUNING INFORMATION WITH USER CONTROLS ARRANGED TO FACILITATE ITS PROGRAMMING

[75] Inventors: Steven A. Steckler, Clark; Alvin R. Balaban, Lebanon, both of N.J.

[73] Assignee: RCA Corporation, New York, N.Y.

[21] Appl. No.: 847,412

[22] Filed: Oct. 31, 1977

[51] Int. Cl.² .............................................. H04B 1/26
[52] U.S. Cl. ................................... 325/464; 325/469
[58] Field of Search ............... 325/453, 455, 459, 464, 325/465, 468, 470, 471, 469; 358/191

[56] References Cited

U.S. PATENT DOCUMENTS

| | | | |
|---|---|---|---|
| 3,893,049 | 7/1975 | Bray | 325/468 |
| 3,968,440 | 7/1976 | Ehni | 325/455 |
| 4,005,368 | 1/1977 | Tanaka | 325/464 |
| 4,041,402 | 8/1977 | Mogi | 325/464 |
| 4,061,982 | 12/1977 | Kawashima | 325/468 |
| 4,114,102 | 9/1978 | Denzene | 325/470 |
| 4,114,104 | 9/1978 | Denzene | 325/470 |

OTHER PUBLICATIONS

Philips Technical Notes 76-1120M for the C81 & C90 Chassis Color T.V. Modular 4 Electronic Tuning System-Optavision Receivers-Nov. 1976.

Omega Tuner System Information Package-Jul. 1975-- General Instrument Corp.
Magnavox Service Manual, No. 7353, File vol. 12, Television Section for the 703777 Videomatic Touch Tune Assembly.
"Digitales Programmspeichter-System"-Friedrich Timmermann-*Funkschau* 1977, Heft 17, pp. 67-69.
"Farbfernsehgerat mit Mikroprozessor-Steurung"- Wolfgang Baum *Funkschau*—1977, Helf, 17.

*Primary Examiner*—Marc E. Bookbinder
*Attorney, Agent, or Firm*—Eugene M. Whitacre; Paul J. Rasmussen; Peter M. Emanuel

[57] ABSTRACT

In a tuning system for a television receiver including tuning voltage circuitry for generating and thereafter storing binary signals representing tuning voltages corresponding to the various channels a viewer may select for controlling a voltage variable tuning element, skip channel circuitry for generating and thereafter storing binary signals representing whether or not each of the channels is preferred, channel selection circuitry for retrieving the stored binary signals when a viewer depresses either an up or down push button, a mode push button is provided in conjunction with sequence detection circuitry to generate various control signals to enable the programming of the tuning voltage circuitry and skip channel circuitry in response to the order and manner in which the mode, up and down push buttons are operated.

8 Claims, 2 Drawing Figures

TUNING SYSTEM INCLUDING A MEMORY FOR STORING TUNING INFORMATION WITH USER CONTROLS ARRANGED TO FACILITATE ITS PROGRAMMING

BACKGROUND OF THE INVENTION

The present invention pertains to the field of tuning systems for television receivers and the like including a memory for storing tuning information.

Tuning systems are known for television receivers which include a memory for storing binary signals representing tuning information. Typically, these systems include a tuning voltage memory having a plurality of memory locations for storing binary signals representing tuning voltages corresponding to the various channels a viewer may select, a digital to analog converter for converting the binary signals stored in the tuning voltage memory into tuning voltages for controlling a voltage variable tuning element such as a varactor diode and channel selection circuitry to address the memory locations of the tuning voltage memory and thereby retrieve the binary signals stored therein when a viewer makes a channel selection by depressing, for example an up or down push button. Often such tuning systems also include a skip channel memory having a plurality of memory locations, also addressed when a viewer depresses either the up or down channel selection buttons, for storing binary signals for each of the channels representing whether it is preferred or not. If a channel is not preferred because, for example, of its reception quality or program content, it is automatically skipped over by the tuning system.

Tuning systems including a memory have advantages over other types of tuning systems because the tuning information stored in the memory may be specifically programmed to accommodate particular tuning conditions at various user locations. Unfortunately, since the particular tuning conditions at various user locations is not known in advance by the manufacturer, it is highly likely users themselves will have to do some programming. Since most users are not familiar with the programming of electronic instruments, it is desirable that the programming apparatus be relatively simple to operate. Furthermore, it is desirable that a viewer be able to operate the programming apparatus for a television tuner including a memory for storing tuning information in a manner at least somewhat analogous to the manner in which television receivers employing conventional rotary tuning knobs are operated. Finally, it is desirable that the programming apparatus include as small a number of programming devices (such as push buttons, switches, indicator lights etc.) as possible and that the devices be relatively inexpensive.

SUMMARY OF THE PRESENT INVENTION

A tuning system for tuning a receiver to various tuning positions such as, for example, channels of a television receiver includes a voltage variable tuning element, tuning voltage circuitry for generating and thereafter storing binary signals representing tuning voltages corresponding to the tuning positions for controlling a voltage variable tuning element, skip tuning position circuitry for generating binary signals of a first type for identifying tuning positions which are not to be skipped and binary signals of a second type for identifying tuning positions to be skipped, and tuning position selection circuitry for retrieving the binary signals stored in the tuning voltage circuitry and the skip tuning position circuitry in response to a selection direction signal generated when a viewer operates a selection direction switch device, such as, for example, an up or a down push button switch. A mode switch, which desirably also is a push button switch, for generating a mode signal when operated and sequence detection circuitry are provided to generate signals to control the programming of the tuning system in response to the manner and sequence in which the mode switch and the selection direction switch is operated. Desirably, the sequence detection circuitry includes first and second sequence detectors. The first sequence detector generates a tuning voltage programming signal in response to the generation of said selection direction signal after the generation of the mode signal and before the termination of signal. In response to the tuning voltage programming signal, the tuning voltage circuitry is enabled to generate the binary signals representing the tuning voltages. The second sequence detector generates a first tuning position signal in response to a sequential generation and termination of the mode signal followed by a sequential generation and termination of the scanning direction signal and then a second sequential generation and termination of the mode signal. The second sequence detector generates a second tuning position signal in response to a first sequential generation and termination of the mode signal followed by a second sequential generation and termination of the mode signal. In response to the first tuning position signal, the tuning position skip circuitry generates binary signals of the first type. In response to the second tuning position signal, the tuning position skip circuitry generates binary signals of the second type.

DETAILED DESCRIPTION OF THE INVENTION

Figure 1:
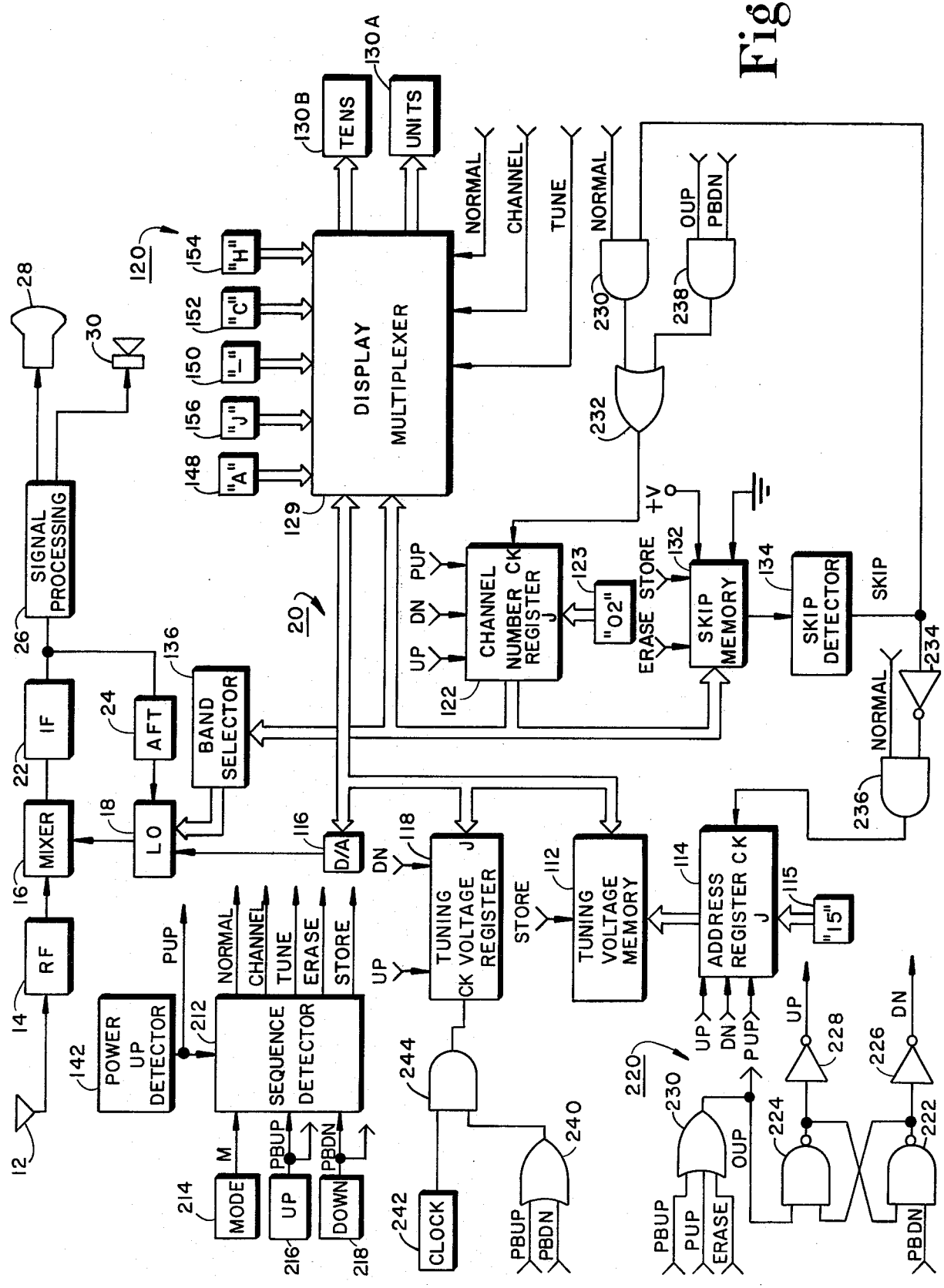
FIG. 1 shows, in block diagram form, a tuning system including a memory for storing tuning information and an arrangement of push buttons operable in conjunction with a sequence detector for detecting the sequence of operation of the push buttons to control the programming and operation of the tuning system in accordance with the present invention.

In FIG. 1, RF (Radio Frequency) signals are received by an antenna 12 and coupled to an RF processing unit 14 where they are filtered, amplified and otherwise processed. The processed RF signals are coupled to a mixer 16 where they are combined with local oscillator signals generated by a local oscillator 18 to produce an IF (Intermediate Frequency) signal. The frequency of the local oscillator signal is controlled in response to a tuning voltage generated by a tuning system 20 in accordance with the channel selected by a viewer so that when it is combined with the RF signals, the IF signal has modulated picture, color and sound carriers at predetermined frequencies. The IF signal is coupled to an IF processing unit 22 where it is filtered, amplified and otherwise processed. A portion of the IF signal is coupled to an AFT (Automatic Fine Tuning) discriminator 24 which generates an AFT signal representing a deviation between the picture carrier frequency and its nominal value, e.g., in the United States 45.75 MHz, which may occur due to component aging or environmental operating conditions. The AFT voltage is coupled to local oscillator 18 to modify the tuning voltage so as to minimize the deviation between the picture carrier frequency and its nominal value. The output of IF processing unit 22 is coupled to a signal processing unit 26 which processes the various components of the IF signal so that a visual response is produced by means of a kinescope 28 and an audio response is produced by means of a speaker 30.

Tuning system 20 is a memory type tuning system which is capable of storing tuning information for tuning a number of preferred channels less than the total number of channels allocated to the television band. For example, while in the United States there are 82 channels (2-83) allocated to the television band by the FCC (Federal Communications Commission), tuning system 20 may be programmed to tune only 16 channels which are preferred by a viewer over the others because of their program content or because of their relative reception characteristic at the viewer's location. Tuning system 20 is similar to that described in copending U.S. Patent application Ser. No. 828,848 filed Aug. 29, 1977 in the name of Billy Wesley Beyers, Jr., which is hereby incorporated by reference, except for the provisions for controlling its normal operation and programming which are constructed in accordance with the present invention as set forth below.

Tuning system 20 includes a tuning voltage memory 112 having 16 memory locations for storing the binary signals representing the tuning voltages for each of 16 channels preferred by the viewer. An address register 114 comprising an up/down counter with provisions for entering binary signals coupled to "jam" inputs, such as, for example, the CD4029 integrated circuit available from RCA Corporation, is coupled to tuning voltage memory 112 to generate binary signals representing the decimal numbers 0-15 to address any of the 16 locations of tuning voltage memory 112. When a location of tuning voltage memory 112 is addressed, the binary signals stored in the addressed location are "read" out of tuning voltage memory 112 and coupled to a D/A (Digital to Analog) converter 116 which converts them to the corresponding DC (Direct Current) tuning voltages for local oscillator 18. A tuning voltage register 118, comprising an up/down counter, is coupled to tuning voltage memory 112 to generate the binary signals stored in each memory location of tuning voltage memory 112 in response to viewer control during a tuning voltage programming mode of operation of tuning system 20. Selected ones of the binary signals generated by tuning voltage register 118 during the tuning voltage programming mode are coupled to a display unit 120, normally utilized to display the number of the channel selected by a viewer, so that numbers related to the tuning voltages are displayed by which a viewer may verify that the pictures obtained correspond to the channels he wishes to program.

Binary signals representing the two digit channel numbers, for example, in the United States between channel 02 and channel 83, are generated by a channel number register 122 comprising two cascaded up/down counters with provisions for entering binary signals at their jam inputs such as, for example, CD4029 integrated circuits available from RCA Corporation, and coupled to display unit 120. In order to reduce the circuitry employed in display unit 120, the binary signals representing the tens position and units position of the channel number are time multiplexed and sequentially processed and coupled to units display unit 130A and tens display unit 130B by display multiplexer (MUX) 129. Units and tens display units 130A and 130B, respectively, comprise seven segment display devices of the light emitting diode or liquid crystal type.

The binary signals generated by channel number register 122 are also coupled to a skip memory 132 to address it. Skip memory 132 includes a memory location for each one of the total number of channels allocated to the television band. Thus the addresses of the 82 locations of skip memory 132 correspond to the 82 channel numbers between 02 and 83. Each memory location of skip memory 132 includes a single cell for storing either a logic "1" when the corresponding channel is not a preferred one and is to be skipped during channel selection and a logic "0" when the corresponding channel is a preferred one and is not to be skipped during channel selection. In response to the presence of a logic "1" in the location of skip memory 132, a skip detector 134 generates a SKIP signal. The "1" and "0" binary signals representing channel skipping information are entered into skip memory 132 in response to viewer control during a channel programming mode.

The binary signals generated by channel number register 122 are in addition coupled to a band selector 136, which may, for example, comprise a read only memory (ROM) to determine from the channel number the frequency band in which the selected channel resides and in response generate a representative band selection signal. Thus, for example, in the United States, band selector 136 generates respective band selection signals for each of the bands of channels 2-6, 7-13 and 14-83. The band selection signals are coupled to local oscillator 18 to control the frequency range in which it oscillates. Local oscillator 18 includes arrangements of varactor diodes which are switched into an oscillator configuration in response to the respective band selection signals to determine the frequency range in which local oscillator 18 oscillates. The specific frequency at which local oscillator 18 oscillates is determined by the magnitude of the tuning voltage.

Control signals for initiating the various normal and programming modes of operation of tuning system 20 referred to above and thereafter controlling its operation during these modes are generated by a sequence detector 212 in response to the manner and sequence in which a viewer operates a MODE push button switch 214, an UP push button switch 216 and a DOWN push button switch 218. Push button switches 214, 216 and 218 are desirably of the momentary type which may be used to generate a first binary signal, e.g., a logic "1" when depressed and automatically return to an undepressed state to generate a second binary signal, e.g., a logic "0", when released such as described in copending U.S. patent application Ser. No. 748,025, filed Dec. 6, 1976 now U.S. Pat. No 4,084,071 in the name of Theodore Dennis Smith, hereby incorporated by reference. Sequence detector 212 generates a NORMAL signal to place tuning system 20 into its normal mode of operation during which a viewer may select channels for normal viewing; a CHANNEL signal to place tuning system into a channel programming mode during which a viewer may program skip memory 132; and a TUNE signal to place tuning system 20 into a tuning voltage programming mode during which a viewer may program tuning voltage memory 112. During the normal mode, the binary contents of channel number register 122 are changed in response to viewer operation of UP push button 216 and DOWN push button 218 to make channel selections for normal viewing. During the channel programming mode, depending on the sequence in which MODE push button 214, UP push button and DOWN push button are operated, sequence detector 212 generates an ERASE signal to enter a logic "1" (by means of a connection to a source of positive voltage +V) into skip memory 132 to identify a nonpreferred channel which is to be skipped during channel selection in the normal mode or a STORE signal to enter a logic "0" (by means of a connection to signal ground) into skip memory 132 to identify a preferred channel which is not be be skipped during channel selection in the normal mode. During the tuning voltage programming mode, the binary contents of tuning voltage register 112 are changed in response to viewer operation of UP push button 216 and DOWN push button 218 to adjust the magnitudes of tuning voltages for each of the preferred channels.

The NORMAL, CHANNEL and TUNE signals are also coupled to display MUX 129 so that symbols representative of the various modes are displayed by means of units display unit 130A and tens display unit 130B as is described in detail in the aforementioned Beyers application. Briefly, during the normal mode in response to the NORMAL signal, the binary signals generated by channel number register 122 are processed by display multiplexer 129 so that the two digit number of the selected channel is displayed. During the channel programming mode in response to a CHANNEL signal, binary signals in a coded format representing the letter "C" (provided by a unit 152 representing appropriate connections to +V and signal ground), binary signals in a coded format representing the letter "H" (provided by a unit 154 representing appropriate connections between +V and signal ground) are coupled and binary signals generated by channel number register 122 are processed by display multiplexer 129 to display the symbol "CH" alternately with the presently selected channel number to identify the channel programming mode. During the tuning voltage programming mode, in response to a TUNE signal, binary signals in a coded format representing the letter "A" (provided by unit 148), logic level signals in a coded format representing the letter "J" (provided by unit 156), binary signals representing the symbol "—" (provided by unit 150) and the binary signals processed by display multiplexer 129 to display the symbol "AJ" alternately with 37 −n", where n is a decimal digit approximation of the instantaneous tuning voltage, to identify the tuning voltage programming or adjustment mode.

In addition to sequence detector 212 and push buttons 214, 216 and 218, the control portion of tuning system 20 includes a power up detector 142 coupled to the power supply circuitry (not shown) of the receiver to generate a PUP (Power UP) signal when the receiver is turned on. The PUP signal is coupled to sequence detector 212 and various portions of tuning system 20 to control their operations. Furthermore, the control portion of tuning system 20 also includes a S-R (Set-Reset) flip-flop 220 comprising cross coupled NAND gates 222 and 224, two inverters 226 and 228 coupled to the outputs of NAND gates 222 and 224, respectively, and an OR gate 230 coupled to an input of NAND gate 224. In response to a PBDN (Push Button DowN), coupled to one input of NAND gate 222, signal generated when the DOWN push button is depressed, DN signal is generated at the output of inverter 226. In response to either a PBUP (Push Button UP) signal, generated when UP push button 216 is depressed, a PUP signal or an ERASE signal, an OUP ("OR"ed UP) is generated by an OR gate 230 and an UP signal is generated at the output of inverter 228. The UP and DN signals are coupled to address register 114, tuning voltage register 118, and channel number register 122 to control the direction in which they count.

In operation, assuming that the tuning system has been programmed as will be explained below, when the receiver is turned on, in response to the generation of a PUP signal, binary signals representing the lowest channel number, e.g., channel number 02 in the United States, are coupled to the "jam" (J) inputs to channel number register 122 from unit 123, binary signals representing the number 15 are coupled to the J inputs to address register 114 from unit 113, sequence detector 212 is reset to place tuning system 20 in the normal mode; and an UP signal is generated by R-S FF (Flip-Flop) 220 to enable it to count in increasing order.

At this point, the contents of the location of skip memory 132 corresponding to channel number 02 are examined by skip detector 134. If a logic "1" is detected, a SKIP signal, representing that channel 2 is not preferred and is to be skipped, is generated. If a logic "0" is detected, a $\overline{SKIP}$ signal (i.e., the logic complement of the SKIP signal), representing that channel 2 is preferred and not to be skipped, is generated.

In response to a SKIP signal, a clocking signal is coupled to the CK (ClocK) input of channel number register 122 from an AND gate 231 and an OR gate 232 and the contents of channel number register 122 are increased by a count of 1 so that the contents of the location of skip memory 132 corresponding to the next channel can be examined. This process continues until a $\overline{SKIP}$ signal is generated. In response to a $\overline{SKIP}$ signal, a clocking signal is coupled to the CK input of address register 114 from an inverter 234 and AND gate 236 and the contents of address register 114 are increased by a count of 1. However, the contents of channel number register 122 are not increased further at this point. Thus, at this point, the contents of channel number register 122 (which is the first address of SKIP memory 132 at which a logic "0" was detected) are displayed by channel number display 120 and the contents of the first location of tuning voltage memory 112 are "read out" and converted to a corresponding tuning voltage.

When a viewer wishes to change the channel in the normal mode, he may do so by depressing either the UP push button 216 or DN push button 218. When UP push button 216 is depressed, a PBUP signal is generated. In response an OUP signal is generated by OR gate 230 and an UP signal is generated by R-S FF 220 (if it has not already been generated in response to the previous generation of a PUP signal or a PBUP signal ). In response to the UP signal, channel number register 122 and address register 114 are enabled to count in increasing order. Furthermore, the contents of channel number register 122 are increased by a count of 1 due to the application of the OUP signal to its CK input through an OR gate 238. Thereafter, the contents of channel number register 122 are successively increased by a count of 1 in response to the successive generation of SKIP signals until a $\overline{SKIP}$ signal is generated. When a $\overline{SKIP}$ signal is generated, the contents of address register 114 are increased by a count of 1 but the contents of channel number register 122 are not further increased. At this point, the channel number of the second preferred channel is displayed and the corresponding tuning voltage is generated. The operation of tuning system 20 when DN push button 218 has been depressed to change the channel is similar to the operation of tuning system 20 when UP push button 216 has been depressed to change the channel, except that channel number register 122 and address register 114 count in decreasing order rather than increasing order.

To place tuning system 20 in the channel programming mode so that a preferred or nonpreferred status may be assigned to each channel, a viewer depresses and releases mode push button 314. In response, an M (Mode) signal is momentarily generated and then terminates. In response to this sequence of operation of mode push button 214, sequence detector 212 generates a CHANNEL signal. At this point, the channel selected prior to the operation of mode push button 214 is displayed alternately with the symbol "CH" by display unit 120. If the viewer wishes to assign preferred status to a channel, he then sequentially depresses either the UP push button 216 or DOWN push button 218 to increase or decrease the contents of channel number register 122 until the channel to be assigned preferred status is reached. When the number of the desired channel is displayed by display unit 120, the viewer then depresses and releases mode push button 214 again. In response to this generation and termination of an M signal, a STORE signal is generated by sequence detector 212 causing a logic "0" to be entered into the memory location of skip memory 132 addressed by the displayed channel number and the termination of the CHANNEL signal causing tuning system 20 to be placed in the normal mode again. It should be noted that since during the channel programming mode it may be desired to restore channels which have been previously assigned nonpreferred status, SKIP and $\overline{\text{SKIP}}$ signals are disabled from being coupled to the CK inputs of channel number register and address register 114 so that channels that would be skipped during channel selection in the normal mode are not skipped during the channel mode by the operation of AND gates 231 and 236, respectively, in response to the presence of a $\overline{\text{NORMAL}}$ signal (i.e., the complement of the NORMAL) which is generated by sequence detector 212 except when tuning system is in the normal mode.

If the viewer wishes to assign the nonpreferred status to a channel, he selects the channel to be assigned the nonpreferred status in the normal manner as described above and then places tuning system 20 in the channel programming mode, as described above, by depressing and releasing mode push button 214. At this point, the channel selected prior to the operation of mode push button 214 is displayed alternately with the symbol "CH". He then again depresses and releases mode push button 214. In response to this second sequential generation and termination of the M signal, sequence detector generates an ERASE signal and a logic "1" is entered in the memory location of skip memory 132 addressed by the display channel number. In response to the generation of an ERASE, sequence detector 212 generates a NORMAL signal to place tuning system 20 into the normal operating mode and OR gate 230 generates an OUP which is coupled to the CK input of channel number register 122 and its contents are increased by 1. At this point, the next preferred channel is tuned in the normal manner described above.

When a viewer wishes to program or reprogram (i.e., fine tune) the tuning voltage for one of the preferred channels, he selects the channel for which the tuning voltage is to be programmed by sequentially depressing either UP push button 216 or DOWN push button 128 until the number of the desired channel is displayed by display unit 120. He then depresses and holds mode push button 214 while depressing either UP push button 216 or DOWN push button 218. In response to the generation of either a PBUP or PBDN signal during the presence of an M signal, sequence detector 212 generates a TUNE signal to place tuning system 20 in the tuning voltage programming or adjustment mode. The TUNE signal is not terminated and tuning system 20 remains in the tuning voltage programming mode until the ones of push buttons 214, 216 and 218 previously depressed are released. In response to the TUNE signal and either one of the PBUP or PBDN ("ORed" by OR gate 240), a clock signal, generated by a clock 242, is coupled by an AND gate 244 to the CK input of tuning voltage register 118. In response, the contents of tuning voltage register 118 and the turning voltage are changed. Furthermore, in response to the TUNE signal, a one digit number representing the tuning voltage is alternately displayed with the symbol "AJ" by display unit 120 so that the viewer may determine, by comparison of the one digit tuning voltage number to a tuning voltage chart provided by the manufacturer, when the tuning voltage is approximately correct. When the viewer is satisfied with the display, he releases all of push buttons 214, 216 and 219 previously depressed. Sequence detector 212 detects the terminations of the M, PBUP and PBDN signals and generates a STORE signal to cause the contents of tuning voltage register to be entered into the presently address location of tuning voltage memory 118 and the termination of the TUNE signal so that tuning system 20 is returned to the normal mode. It should also be noted that once tuning system 20 has been placed in the tuning voltage programming mode by operation of either UP push button 216 or DOWN push button 218 while MODE push button 214 is depressed, it is not necessary for an operator to continue to hold MODE push button 214 depressed and simultaneously operate one of UP push button 216 or DOWN push button 218 since the release of all three is required to terminate the TUNE signal. This is desirable since a viewer may accidentally release MODE push button 214 during tuning voltage adjustment. It should be noted that tuning system 20 may be placed in the tuning voltage programming mode from either the normal mode (after a channel has been selected in the normal manner) or from the channel mode after a channel has been assigned the preferred status as described above.

Thus, control of tuning system 20 is accomplished by the operation of only three momentary push button type switches: two push button switches are utilized for the normal channel selection mode of operation; and a third push button switch is operated in predetermined sequences with the first two push button switches to initiate and control channel and tuning voltage programming modes of operation. The present arrangement not only uses a minimum number of control elements but also utilizes control elements, i.e., push button switches such as used in calculator type keyboards, which are relatively inexpensive compared to other types of control elements such as rotary and other multiple position switches conventionally employed. Furthermore, the control sequence is a relatively simple one for the ordinary viewer to utilize:

selection of a channel
    operate either UP push button 216 or DOWN push button 218 to obtain the desired channel.

additional of a channel
    press and release mode push button 214;
    operate either UP push button 216 or DOWN push button 218 to obtain the channel to be added;
    press and release MODE push button 214.

deletion of a channel
    operate either UP push button 216 or DOWN push button 218 to obtain the channel to be deleted;
    press and release MODE push button 214 twice in succession.

tuning voltage adjustment
    operate either UP push button 216 or DOWN push button 218 to obtain the channel for which the tuning voltage is to be adjusted;
    hold MODE push button 214 and operate UP push button 216 or DOWN push button 218 until the display is satisfactory;
    release all push buttons.

Furthermore, since after the completion of each programming control sequence tuning system 20 is automatically returned to the normal mode, tuning system 20 cannot inadvertently be left in a condition which may be confusing to an ordinary viewer without programming mode display (i.e., "CH" or "AJ") which may be the case if nonmomentary multiple position switches were employed. In addition, it will be noted that the tuning voltage programming procedure in which MODE push button 214 is held depressed while either UP push button 216 or DOWN push button 218 is operated, is somewhat analagous to the manner in which a conventional mechanical tuning system including a turret type tuner with a rotary channel selector switch which is depressed an rotated for fine tuning is operated.

Figure 2:
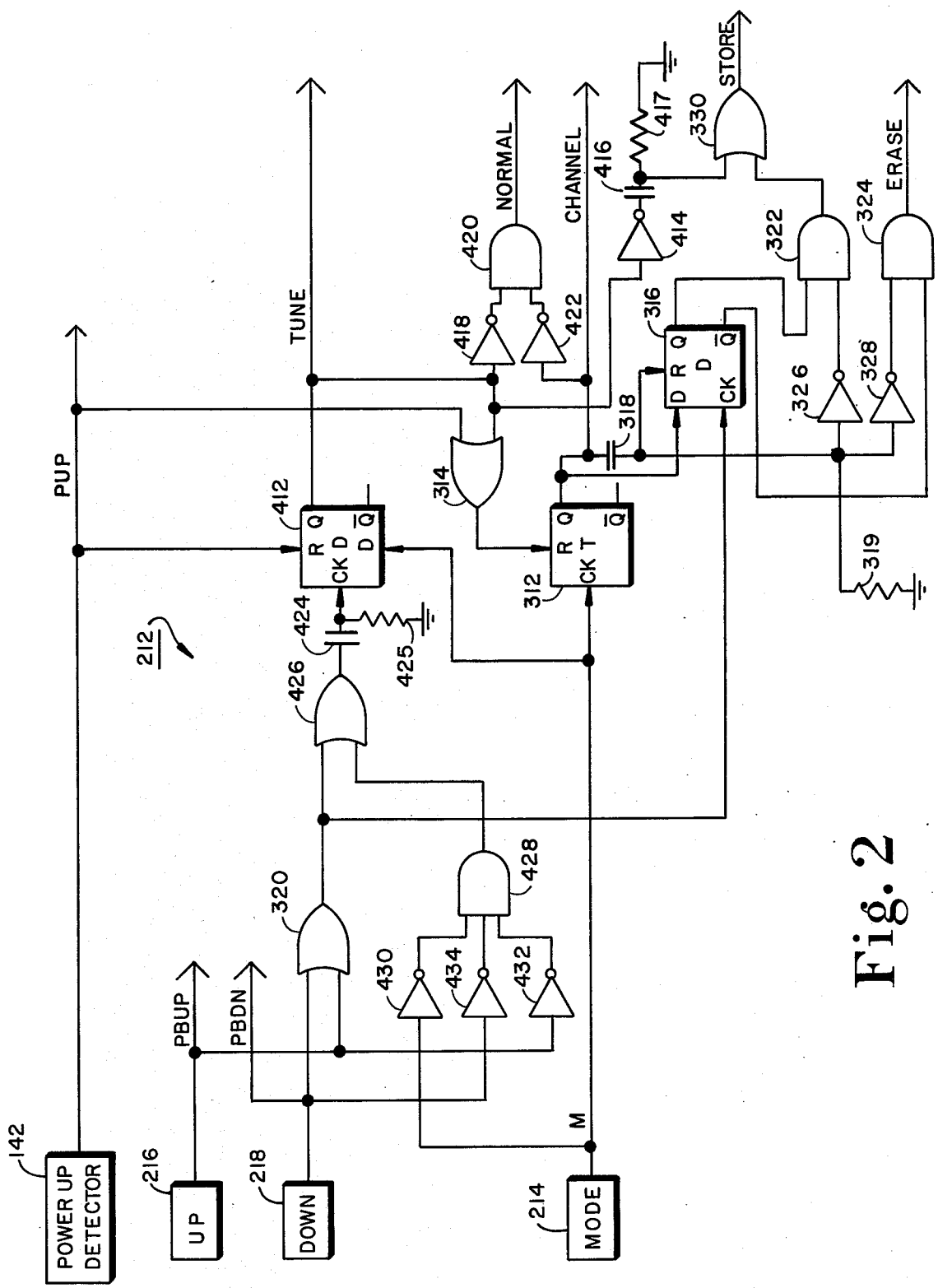
FIG. 2 shows, in logic diagram form, an implementation of the sequence detector of the system of FIG. 1 constructed in accordance with the present invention.

Turning now to the logic implementation of sequence detector 212 shown in FIG. 2, a first logic configuration, including a T FF (Trigger Flip-Flop) 312, an OR gate 314, a D (Data) FF 316, a differentiating circuit formed by a capacitor 318 and a resistor 319, an OR gate 320, AND gates 322 and 324, inverters 326 and 328 and an OR gate 330, is utilized to detect the sequence of operation of MODE push button switch 214, UP push button 216 and DOWN push button switch 218 to initiate and thereafter control the channel programming mode. T FF 312 is alternately set, causing the generation of a logic "1" at its Q output and a logic "0" at its $\overline{Q}$ output, and reset, causing the generation of a logic "0" at its Q output and a logic "1" at its $\overline{Q}$ output, in response to the successive application of negative-going pulses at its CK input. The CHANNEL signal is generated at the Q output of T FF 312. D FF 316 is set in response to the application of a positive-going pulse to its CK input if the signal coupled to its D input at that time is a logic "1" and is reset in response to the application of a positive-going pulse to its CK input if the signal coupled to its D input at that time is a logic "0". The STORE signal is generated at the output of OR gate 330. The ERASE signal is generated at the output of AND gate 324.

In operation, assuming that T FF 312 has been reset in response to the generation of a positive-going reset pulse by OR gate 314 when a TUNE signal of a PUP signal is generated, when MODE push button switch 214 is depressed and released, the negative-going edge of the resultant M signal sets T FF 312 and a CHANNEL signal is generated. In response to the positive-going edge of the CHANNEL signal coupled to the R (Reset) input of D FF 316 through capacitor 318, D FF 316 is reset. As long as T FF 312 is set, a logic "1" is coupled to its D input. Therefore, assuming that MODE push button switch 214 has been released when either UP push button 216 or DOWN push button 218 is depressed, a logic "1" is coupled to the D input of D FF 316 when a positive-going pulse, generated by OR gate 320 in response to either a PBUP or PBDN signal, is coupled to its CK input causing D FF 316 to be set. (If MODE push button switch 214 has not been released when UP push button switch 216 or DOWN push button switch 218 has been depressed, a TUNE signal will be generated, as will be later seen, and T FF 312 will be reset.) When MODE push button is again depressed and released after the operation of either UP push button switch 216 or DOWN push button 218, T FF 312 is reset in response to the negative-going edge of the second M signal but D FF 316 is not. At this point then, the Q output of D FF 316 is a logic "1". Thus, when the Q output of D FF 312 falls in response to the second M signal, a negative-going edge of the CHANNEL signal is coupled to inverter 326 through capacitor 318 and inverted to form a positive-going pulse. In response to the positive-going pulse, AND gate 322, which has been enabled by the logic "1" at the Q output of D FF 316, generates a positive-going pulse which is coupled through OR gate 322 as the STORE signal.

If UP push button switch 216 or DOWN push button switch 218 is not operated after MODE push button switch 214 has been depressed and released, as above, T FF 312 will be set. However, D FF 316 will not be set and its Q output will be at a logic "1" due to the absence of the application of a positive-going clocking pulse from OR gate 320. Thus, if MODE push button 214 is depressed and released twice in succession, the negative-going edge of the CHANNEL signal, generated in response to the second M signal, will be inverted by inverter 328 and AND gate 324, enabled by the logic "1" at the $\overline{Q}$ output of D FF 316, will generate an ERASE signal.

A second logic configuration of sequence detector 212, including a D FF 412, an inverter 414, a differentiating circuit formed by a capacitor 416, and a resistor 417, a differentiating circuit formed by a capacitor 424 and resistor 425, an OR gate 426, AND gate 428, inverters 430, 432 and 434 and in addition OR gate 320, is utilized to determine the manner and sequence of operation of MODE push button 214, UP push button 216 and DOWN push button 218 to initiate and control the tuning voltage programming mode of tuning system 20. D FF 412 is reset in response to a PUP signal. If MODE push button 214 is depressed, a logic "1" is coupled to the D input of D FF 412. If while MODE push button 214 is held depressed, either UP push button switch 216 or DOWN push button switch 218 is operated, a positive clocking pulse is coupled to the CK input of D FF 412 through OR gates 320 and 426 and capacitor 424, and D FF 412 is set to generate a TUNE signal at its Q output. The rising edge of TUNE signal is coupled through OR gate 314 to the R input of T FF 312 to reset it as referred to above.

If both UP push button 216 and DOWN push button 218 are released, logic "1's" are coupled to two inputs of AND gate 428 through inverters 432 and 434, respectively. If MODE push button 214 is then released, a logic "0" is coupled to the D input of D FF 412 and a logic "1" is coupled to the other input of AND gate 428 through inverter 430. In response, a positive-going pulse is coupled to the CK input of D FF 412 through AND gate 428, OR gate 426 and capacitor 424. As a result, D FF 412 is reset and the TUNE signal is terminated. In response to the negative-going edge of the TUNE signal, a negative-going pulse is coupled to inverter 414 and inverted to form a positive-going pulse. The positive-going pulse is coupled through capacitor 416 and OR gate 330 as a store signal. It is noted that the TUNE signal is terminated and a STORE signal is generated in a similar fashion if MODE push button 214 is first released and then both UP push button 216 and DOWN push button 218 are released.

Inverters 418 and 422 and AND gate 420 of sequence detector 212 are utilized to generate the NORMAL signal. When both T FF 312 and D FF 412 are reset, logic "1's" are coupled to the inputs of AND gate 420 through inverters 418 and 422, and in response, a NORMAL signal is generated.

While sequence detector 212 has been described in terms of a logic implementation, it will be appreciated that the detection of the manner and sequence of the operation of MODE push button switch 214, UP push button switch 216 and DOWN push button switch 218 may be detected by means of a microprocessor having a subroutine programmed accordingly. These and other modifications are considered to be within the scope of the present invention.

What is claimed is:

1. In a tuning system for a receiver including a voltage variable tuning element for tuning the receiver to various tuning positions a user may select, apparatus comprising:

tuning voltage means for generating binary signals representing tuning voltages corresponding to said tuning positions for controlling said voltage variable tuning element;

first memory means including a plurality of memory locations for storing the binary signals representing said tuning voltages;

converter means for converting the binary signals representing said tuning voltages to said tuning voltages, said tuning voltages being coupled to said tuning element;

skip means for generating binary signals of first and second types representing preferred and non-preferred conditions, respectively, of said tuning positions;

second memory means including a plurality of memory locations for storing the binary signals generated by said skip means;

tuning position selection means including at least a first direction switch means for outputting the binary signals stored in the memory locations of said first and second memory locations, the binary signals stored in ones of said memory locations of said first memory means normally being outputted only when said first type of binary signal is stored in ones of said memory locations of said second memory means corrresponding to the same tuning positions, the binary signals outputted from memory locations of said first memory means being coupled to said converter means;

mode switch means; and sequence detection means coupled to said first direction switch and said mode switch for generating a tuning voltage programming signal to enable the operation of said tuning voltage means, a first tuning position programming signal to cause said skip means to generate said first type of binary signals, and a second tuning position programming signal to cause said skip means to generate said second type of binary signals in response to first, second and third operational sequences, respectively, of said mode switch and said first direction switch.

2. The apparatus recited in claim 1 wherein:

said tuning position means includes tuning position counter means for generating binary signals representing said tuning positions, and address means for addressing the memory locations of said first and second memory means in response to the binary signals representing said tuning positions;

said first switch means generates a first counting direction signal when operated;

said tuning position counter counting in a first counting direction to generate the binary signals representing said tuning positions in response to said first direction signal;

said mode switch means generates a mode signal when operated;

said sequence detection means detects the sequence in which said mode signal and said first counting direction signal are generated and terminated to generate said first and second tuning position programming signals; and said tuning voltage means includes tuning voltage counter means for counting in said first direction to generate the binary signals representing said tuning voltages in response to the simultaneous presence of said tuning voltage programming signal and said first counting direction signal.

3. The apparatus recited in claim 2 wherein:

said sequence detection means includes first means for generating said tuning voltage programming signal in response to the generation of said first counting direction signal after the generation of said mode signal and before the termination of said mode signal.

4. The apparatus recited in claim 3 wherein:

said sequence detection means includes second means for generating said first tuning position programming signal in response to a first sequential generation and termination of said mode signal followed by a sequential generation and termination of said first counting direction signal and then a second sequential generation and termination of said mode signal, and a second tuning position programming signal in response to a first sequential generation and termination of said mode signal followed by a second sequential generation and termination of said mode signal.

5. The apparatus recited in claim 4 wherein:

said tuning position selection means includes a second direction switch means for generating a second direction counting signal when operated;

said tuning position counter means counts in a second counting direction to generate said binary signals representing said tuning positions in response to said second counting direction signal, said first means generates said tuning voltage programming signal in response to the generation of one of said first and second direction signals after the generation of said mode signal and before the termination of said mode signal;

said tuning voltage counter means counts in said first counting direction to generate binary signals representing said tuning voltages in response to the simultaneous presence of said tuning voltage programming signal and said first counting direction signal;

said tuning voltage counter means counts in said second counting direction to generate binary signals representing said tuning voltages in response to the simultaneous presence of said tuning voltage programming signal and said second counting direction signal;

said second means generates said first tuning position signal in response to a first sequential generation and termination of said mode signal followed by a sequential generation and termination of one of said first and second counting direction signals and then a second sequential generation and termination of said mode signal.

6. The apparatus recited in claim 4 wherein:

said second means includes tuning position programming enable means for generating a tuning position programming enable signal in response to a first sequential generation and termination of said mode signal and for terminating said tuning position programming enable signal in response to a second sequential generation and termination of said mode signal;

said sequence detector means includes NORMAL means for generating a NORMAL signal in response to the absence of both of said tuning voltage programming signal and said tuning position programming enable signal;

said first direction switch means includes means for generating said first direction counting signal in response to said second tuning position programming signal;

said tuning position counter means including skip tuning position means for generating a skip signal to cause said tuning position counter to count in said first counting direction in response to all of said NORMAL signal, said first counting direction signal and said second type of binary signals, and to cause said tuning position counter to count in said second counting direction in response to all of said NORMAL, said second counting direction signal and said second type of binary signals;

said skip tuning position means being inhibited from generating said skip signal in response to said tuning position programming enable signal.

7. The apparatus recited in claim 6 wherein:

said sequence detector means includes store means for generating a STORE signal in response to the termination of all of said mode signal, said first counting direction signal and said counting direction signal; and said first memory means stores the binary signals generated by said tuning voltage means in response to said STORE signal.

8. The apparatus recited in claim 7 wherein:

said first direction switch means is a first momentary push button switch mechanism which generates said first direction signal only when it is depressed and returns automatically to a nondepressed condition when it is released;

said second direction switch means is a second momentary push button switch mechanism which generates said second direction signal only when it is depressed and returns automatically to a nondepressed condition when it is released; and said mode direction switch means is a third momentary push button switch mechanism which generates said mode signal only when it is depressed and returns automatically to a nondepressed condition when it is released.

* * * * *

UNITED STATES PATENT AND TRADEMARK OFFICE
CERTIFICATE OF CORRECTION

PATENT NO. : 4,164,711

DATED : August 14, 1979

INVENTOR(S) : Steven Alan Steckler et al

It is certified that error appears in the above-identified patent and that said Letters Patent is hereby corrected as shown below:

Col. 8, line 22, "turning" should be --tuning--.
Col. 9, line 59, "alogic" should be --a logic--.
Col. 9, line 67, "of" should be --or--.
Col. 10, line 36, "Q" should be --$\bar{Q}$--.

Signed and Sealed this

Eleventh Day of March 1980

[SEAL]

Attest:

*Attesting Officer*

SIDNEY A. DIAMOND

*Commissioner of Patents and Trademarks*